US010495263B2

(12) United States Patent
Chowdhury et al.

(10) Patent No.: US 10,495,263 B2
(45) Date of Patent: Dec. 3, 2019

(54) LED FILAMENT LAMPS WITH WHITE FILAMENT APPEARANCE

(71) Applicant: GE LIGHTING SOLUTIONS, LLC, East Cleveland, OH (US)

(72) Inventors: Ashfaqul I. Chowdhury, Broadview Heights, OH (US); Tomislav Josip Stimac, Concord, OH (US); Kevin Jeffrey Benner, Solon, OH (US); James William Firis, South Euclid, OH (US)

(73) Assignee: Consumer Lighting (U.S.), LLC, Norwalk, CT (US)

( * ) Notice: Subject to any disclaimer, the term of this patent is extended or adjusted under 35 U.S.C. 154(b) by 0 days.

(21) Appl. No.: 15/922,021

(22) Filed: Mar. 15, 2018

(65) Prior Publication Data
US 2019/0128481 A1 May 2, 2019

Related U.S. Application Data

(60) Provisional application No. 62/578,200, filed on Oct. 27, 2017.

(51) Int. Cl.
*H05B 33/04* (2006.01)
*F21K 9/232* (2016.01)
*F21V 3/10* (2018.01)
*H01L 25/00* (2006.01)

(52) U.S. Cl.
CPC ............... *F21K 9/232* (2016.08); *F21V 3/10* (2018.02); *H01L 25/00* (2013.01)

(58) Field of Classification Search
CPC ... F21K 9/64; F21K 9/232; F21V 3/10; H05B 33/04; H05B 33/08
See application file for complete search history.

(56) References Cited

U.S. PATENT DOCUMENTS

| 3,875,456 A * | 4/1975 | Kano ..................... G08G 1/095 |
| | | 257/89 |
| 4,999,219 A | 3/1991 | Klinedinst et al. |
| 7,514,867 B2 * | 4/2009 | Yano ....................... F21S 6/003 |
| | | 257/100 |
| 8,729,790 B2 | 5/2014 | Seibel, II et al. |
| 9,537,052 B2 | 1/2017 | Seibel, II et al. |
| 9,893,038 B2 * | 2/2018 | Okubo ................. H01L 25/0753 |
| 2009/0267484 A1 * | 10/2009 | Kasakura ........... C09K 11/0883 |
| | | 313/502 |
| 2012/0087103 A1 | 4/2012 | Dai et al. |
| 2014/0175488 A1 * | 6/2014 | Kashiwagi ............ H01L 33/501 |
| | | 257/98 |
| 2014/0198480 A1 | 7/2014 | Dai et al. |
| 2016/0161088 A1 * | 6/2016 | Sung ......................... F21V 9/16 |
| | | 362/97.1 |

FOREIGN PATENT DOCUMENTS

WO 2016/077196 A1 5/2016

\* cited by examiner

*Primary Examiner* — Karabi Guharay
(74) *Attorney, Agent, or Firm* — Wood IP LLC

(57) ABSTRACT

An overcoated LED filament includes an LED filament comprising one or more LED dies coated with an underlying layer of a phosphor material exhibiting a colored appearance, and an over-coated layer comprising a resinous material loaded with a scattering agent that causes the LED filament to appear white.

30 Claims, 20 Drawing Sheets

LED FILAMENT LAMPS WITH WHITE FILAMENT APPEARANCE

BACKGROUND

It is typical for a lighting apparatus, such as a light fixture, luminaire, decorative or general purpose lamp, a tube, or other light emitting device or other illumination system, to include one or more light emitting diode (LED) filaments, which are composed of a linear series of LED dies arranged on a transparent substrate, supported or held in an envelope to give the appearance of an incandescent filament. The filaments are typically constructed with InGaN blue-emitting LED dies carried on a substantially linear glass or sapphire substrate and covered or encapsulated with a blend of silicone and phosphor. Often, the encapsulating blend may have a yellow or other color in the un-lit state. An exemplary LED filament with a yellow covering is shown in FIG. 1A. FIGS. 1B and 1C show LED filaments having a colored appearance incorporated into different types of lighting apparatus. The appearance of the filaments may be disadvantageous due to objections to the yellow color in the unlit state, especially when used for decorative lamps and general purpose lamps.

SUMMARY

The disclosed embodiments are directed to providing an LED filament that appears white in the un-lit, or unpowered state. An overcoated LED filament is disclosed comprising an LED filament comprising one or more LED dies coated with an underlying layer of a phosphor material exhibiting a colored appearance, and an over-coated layer comprising a resinous material loaded with a scattering agent that causes the LED filament to appear white.

According to the disclosed embodiments, an overcoated LED filament includes an LED filament comprising one or more LED dies coated with an underlying layer of a phosphor material exhibiting a colored appearance, and an over-coated layer comprising a resinous material loaded with a scattering agent that causes the LED filament to appear white. For example, the over-coated layer may cause the LED filament to appear white when in an un-lit state. By "underlying layer" is typically meant that the layer of a phosphor material exhibiting a colored appearance, is underlying the over-coated layer. That is, the underlying layer is between the over-coated layer and the LED die(s). There may or may not be intervening layers between the LED die and the underlying layer, and/or between the underlying layer and the over-coated layer. Typically, in this disclosure, the references to "colored" or "white" appearance relate to the color of the material when not being energized by an exciting wavelength. For example, if an underlying layer only comprises phosphor powders that are white powders when viewed under non-exciting visible light, then they would not be considered as "colored" even though they may emit a color when excited to luminescence.

The underlying layer of a phosphor material may exhibit a yellow, orange, or red appearance.

The underlying layer of a phosphor material may include a doped phosphor with a fluoride host.

The underlying layer of a phosphor material may include a phosphor material comprises PFS phosphor ($K_2SiF_6$:$Mn^{4+}$).

The underlying layer of a phosphor material may include a yellow-emitting or a yellow-green-emitting phosphor such as a a garnet phosphor.

The underlying layer of a phosphor material may include red-emitting phosphor such as an $Eu^{2+}$ red nitride phosphor.

The underlying layer of a phosphor material may include an absorbing agent.

The underlying layer of a phosphor material may include the resinous material.

The resinous material loaded with a scattering agent may exhibit a uniform appearance across a visible range of light.

The resinous material may exhibit a refractive index substantially matching a refractive index of the underlying layer.

The resinous material may exhibit a coefficient of thermal expansion substantially matching a coefficient of thermal expansion of the underlying layer.

The resinous material and the scattering agent may exhibit different indexes of refraction.

The scattering agent and/or resinous material may include a polymer.

The scattering agent may include one or more of a fluoropolymer or a cyclic olefin copolymer.

The scattering agent may include one or more non-absorbing metal oxides, metal nitrides or metal halides.

The scattering agent may include one or more non-absorbing semiconductor oxides, semiconductor nitrides or semiconductor halides.

The scattering agent may include one or more of alumina, titania, silica, zirconia, quartz, or glass powder.

The over-coated layer may comprise alumina scattering agent in an amount of 0.1-10% by weight.

The over-coated layer may comprise titania scattering agent in an amount of 0.01%-1% by weight.

The scattering agent may include a combination of 3.0-7.0 by weight alumina and 0.1-0.5% by weight titania.

The over-coated layer may include a doped phosphor with a fluoride host.

The over-coated layer may include PFS phosphor ($K_2SiF_6$:$Mn^{4+}$).

The over-coated layer may include a yellow-emitting or yellow-green-emitting phosphor such as a garnet phosphor.

The over-coated layer may include an $Eu^{2+}$ red nitride phosphor.

The over-coated layer may include an absorbing agent.

The over-coated layer may include a Neodymium compound.

The disclosed embodiments are also directed to a lighting apparatus comprising the overcoated LED filament as disclosed herein.

BRIEF DESCRIPTION OF THE DRAWINGS

The foregoing aspects and other features of the embodiments are explained in the following description, taken in connection with the accompanying drawings, wherein.

DETAILED DESCRIPTION

Figure 1A:
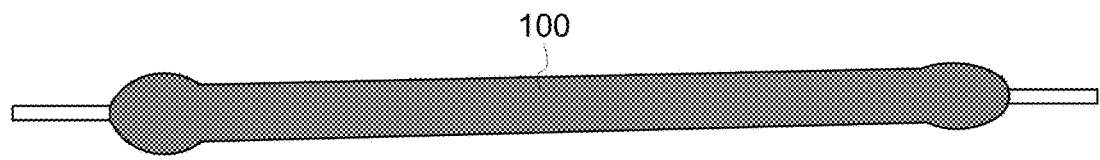
FIGS. 1A-1C show LED filaments with a colored covering in various implementations.
Figure 1B:
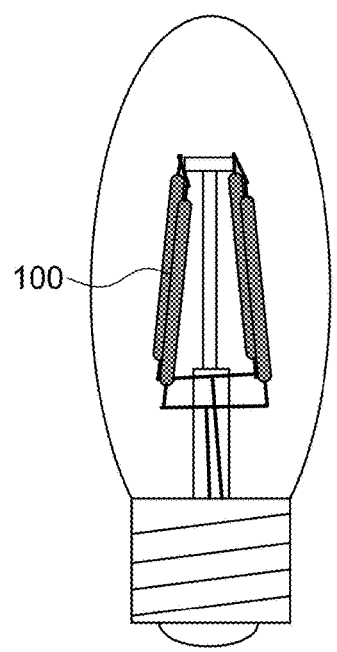
Figure 1C:
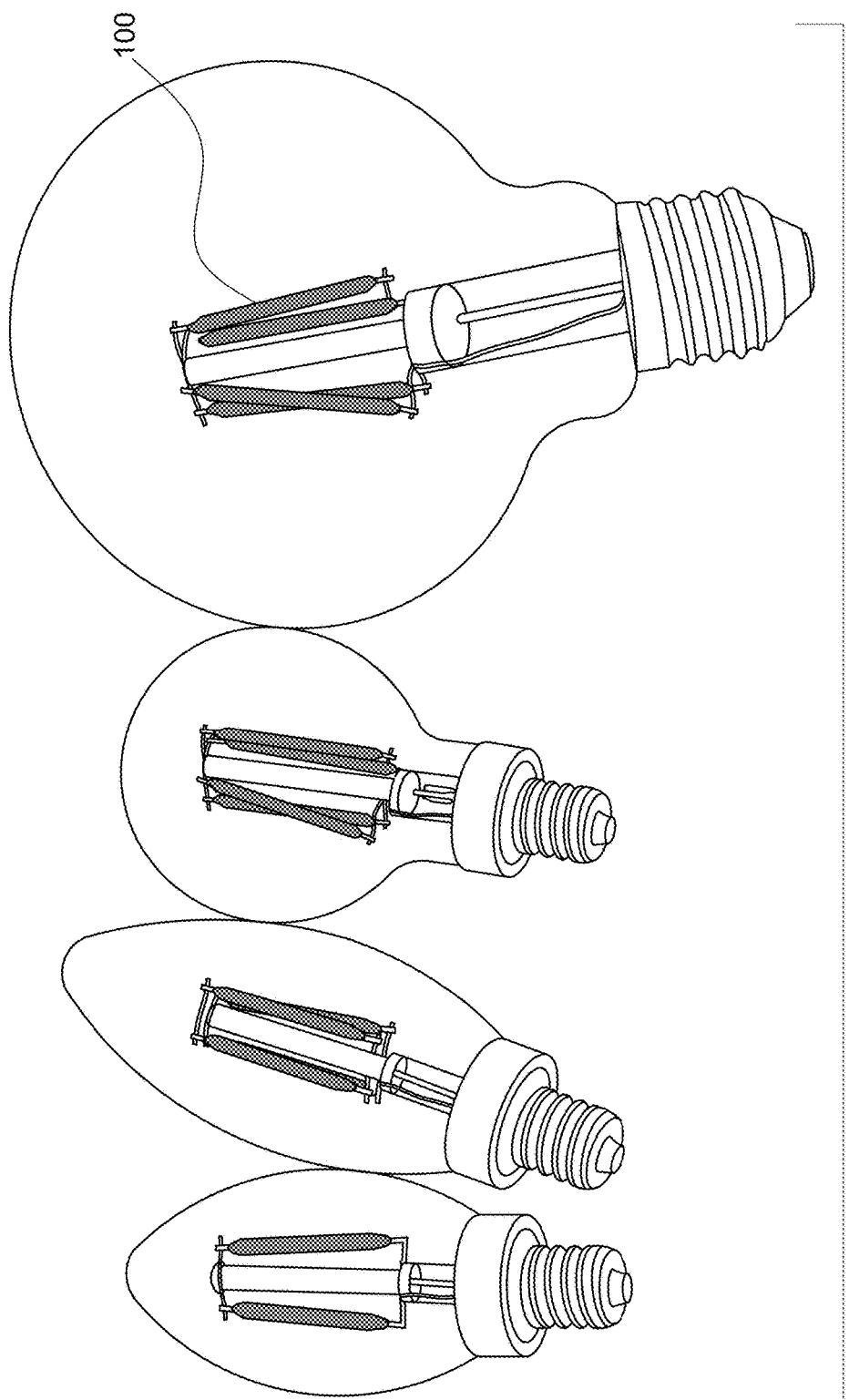

Although the disclosed embodiments will be described with reference to the embodiments shown in the drawings and described below, it should be understood that these could be embodied in many alternate forms. In addition, any suitable size, shape or type of elements or materials could be used.

One or more embodiments of the present disclosure are directed to an LED apparatus comprising one or more LED filaments, at least one of which has a white appearance, instead of a colored appearance. This may be accomplished, for example, by providing an overcoating that changes the appearance of the LED filament from a colored appearance to a white appearance while maintaining acceptable performance levels. The disclosed embodiments are directed to minimizing the difference between the spectral power distributions of the colored-appearance and white-appearance filaments, minimizing lumen (white flux) losses, and minimizing radiated power losses, for example, to approximately <5%. For purposes of the disclosed embodiments, an example of a white appearance generally includes a uniform white appearance across the visible range of light.

One or more embodiments are directed to an LED filament comprising LED dies coated with an underlying layer of a phosphor material exhibiting a colored appearance, over-coated with a layer comprising a resinous material loaded with a scattering agent that causes the LED filament to appear white. The underlying layer may include one or more phosphors, such as a $Mn^{4+}$ doped potassium fluorosilicate (PFS) based red phosphor, other $Mn^{4+}$ doped phosphors with fluoride hosts, other $Eu^{2+}$ doped red nitride phosphors, a yellow-green phosphor such as a cerium-doped yttrium aluminum garnet (Ce:YAG) or other garnet compositions. The underlying layer may also include an absorbing agent, for example, a neodymium oxide-fluoride ($NdF_xO_y$).

Figure 2:
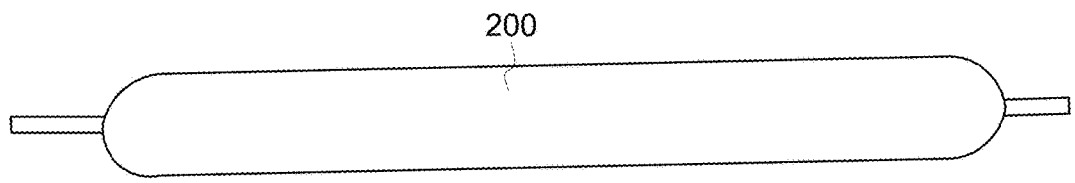
FIG. 2 shows an exemplary LED filament with a white appearance according to the disclosed embodiments.

An exemplary LED filament, overcoated according to the disclosed embodiments, is illustrated in FIG. 2.

The resinous material of the overcoating may include a polymer, for example, a silicone, an epoxy, or an acrylate. The characteristics of the resinous material may be matched to those of the underlying layer to minimize stress and optical interference loss at the interface between the resinous material and the underlying layer. In one or more embodiments, the resinous material of the overcoating may at least have a refractive index close to, or substantially matching the refractive index of the underlying layer. In some embodiments, the resinous material may have a refractive index of approximately 1.4-1.6. In some embodiments, the coefficient of thermal expansion of the resinous material may be close to, or substantially matching that of the underlying layer. An exemplary coefficient of thermal expansion of the resinous material may be 310 µm/m-° C. In one or more embodiments, the resinous material may have one or more of the same mechanical, thermal, optical, electrical, or any other suitable properties as those of the underlying layer. In some embodiments, the resinous material may be the same as a resinous material used for the underlying layer. An example of the resinous coating may be a two-part polydimethylsiloxane elastomer.

The resinous material may be loaded with a scattering agent that provides a white appearance to the overcoated LED filament but only minimally absorbs light. The scattering agent may be inorganic and generally has a refractive index different from the resinous material, such that the greater the refractive index mismatch between the scattering agent and the resinous material, the greater the scattering effect and the whiter the appearance. The scattering agent may include one or more of, for example, alumina, titania, silica, zirconia, quartz, a fluoropolymer, a cyclic olefin copolymer, or any other suitable polymer, one or more non-absorbing metal/semiconductor oxides/nitrides/halides, or glass powder. In some embodiments, the resinous material may further be loaded with one or more of a phosphor, such as a $Mn^{4+}$ doped potassium fluorosilicate (PFS) based red phosphor, other $Mn^{4+}$ doped phosphors with fluoride hosts, other $Eu^{2+}$ doped red nitride phosphors, a yellow-green phosphor such as a cerium-doped yttrium aluminum garnet (Ce:YAG) or other garnet compositions.

In some embodiments, the resinous material may further be loaded with one or more absorbing agents, for example, a neodymium compound such as $NdF_xO_y$. In at least one embodiment, the material used to load the resinous material may have an exemplary particle size of approximately <10 microns.

Figure 3:
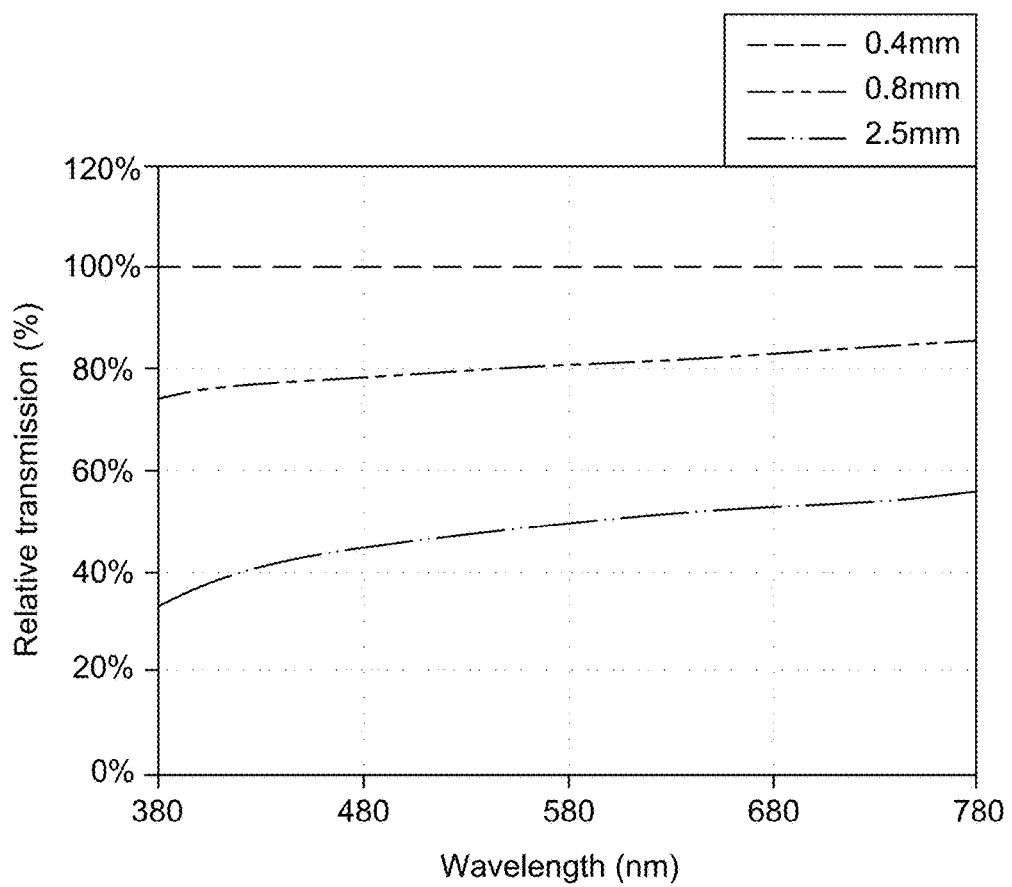
FIG. 3 shows relative spectral transmissions for an overcoating layer loaded with alumina at different thicknesses.

FIG. 3 shows relative spectral transmissions for a silicone overcoating layer loaded with 10% by weight alumina, at thicknesses of 0.4 mm, 0.8 mm, and 2.5 mm. The transmission shown is relative to the transmission of the thinnest layer (0.4 mm). As layer thickness increases, the transmission becomes slightly less uniform and therefore slightly less white, due to the increased scattering and absorption of blue wavelengths compared to longer wavelengths. Even at relatively large thicknesses such as 2.5 mm, the visual appearance of the transmitted light appears white to a human observer.

In some embodiments, the overcoating may be prepared by weighing out a weight of the resinous material, for example, an elastomeric base and a curing agent, and adding the scattering agent. In at least one exemplary embodiment, the resinous material may be made up by weighing out approximately 15 g of an elastomer base, to which is added 10% by weight curing agent. In addition, approximately 10% by weight of a scattering agent may be added to form the overcoating. In another embodiment, the resinous material may be made up by weighing out approximately 15 g of an elastomer base, with 10% by weight curing agent, and the overcoating formed by adding 1.0% by weight of a another scattering agent. It should be understood that the amounts of the different components of the overcoating are exemplary and that any suitable amounts may be utilized. The overcoating may be de-aerated, for example, in a vacuum chamber or centrifugal mixer or by other methods, to remove air pockets and prevent bubbles from forming.

The overcoating may applied to a conventional LED filament by various processes, for example, spraying, molding, dipping, application by an automatic or manual fluid dispenser, or any other suitable application process. An exemplary molding process for applying the overcoating is illustrated in FIGS. 4A-4D.

Figure 4A:
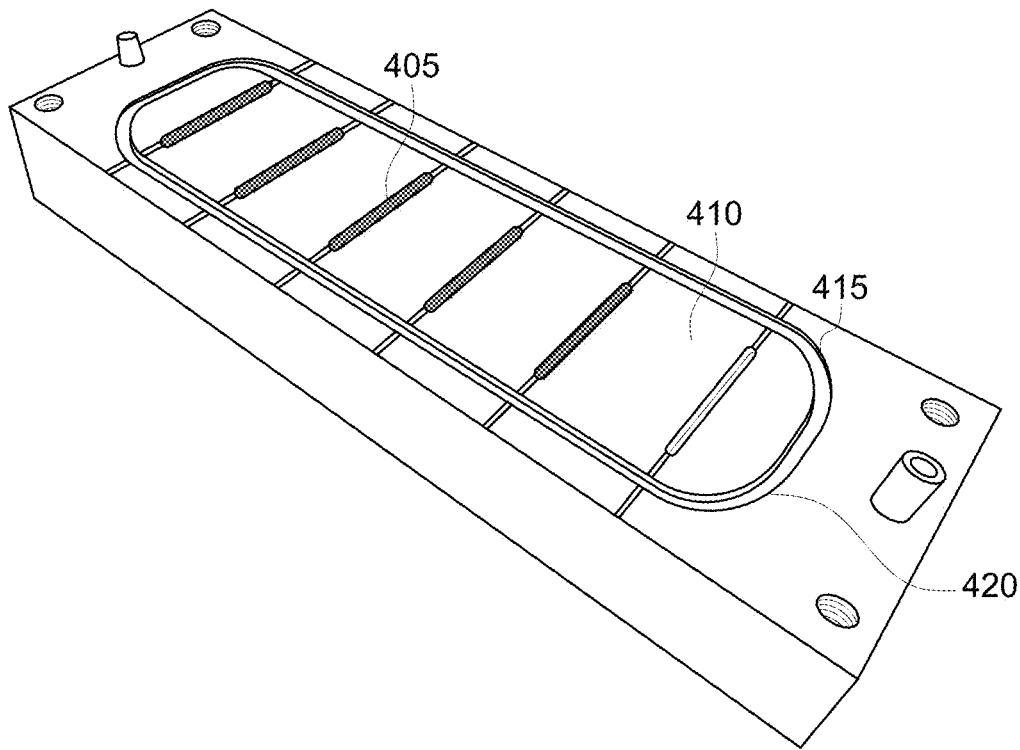
FIGS. 4A-4D show an exemplary process for producing an overcoated LED filament according to the disclosed embodiments.
Figure 4B:
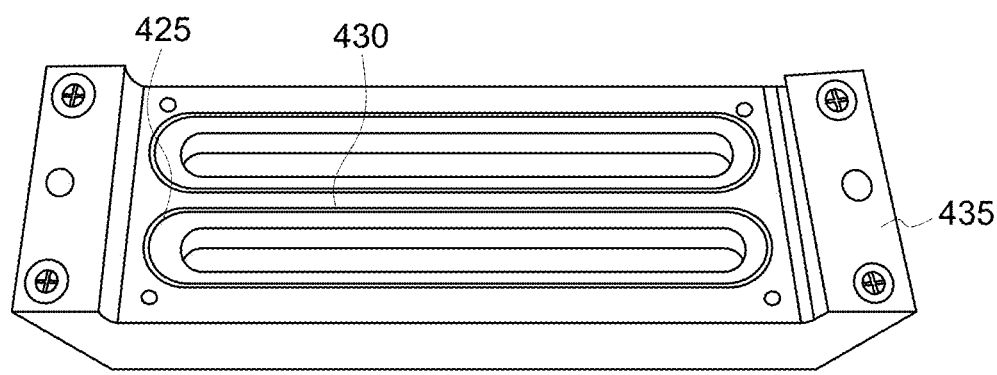
Figure 4C:
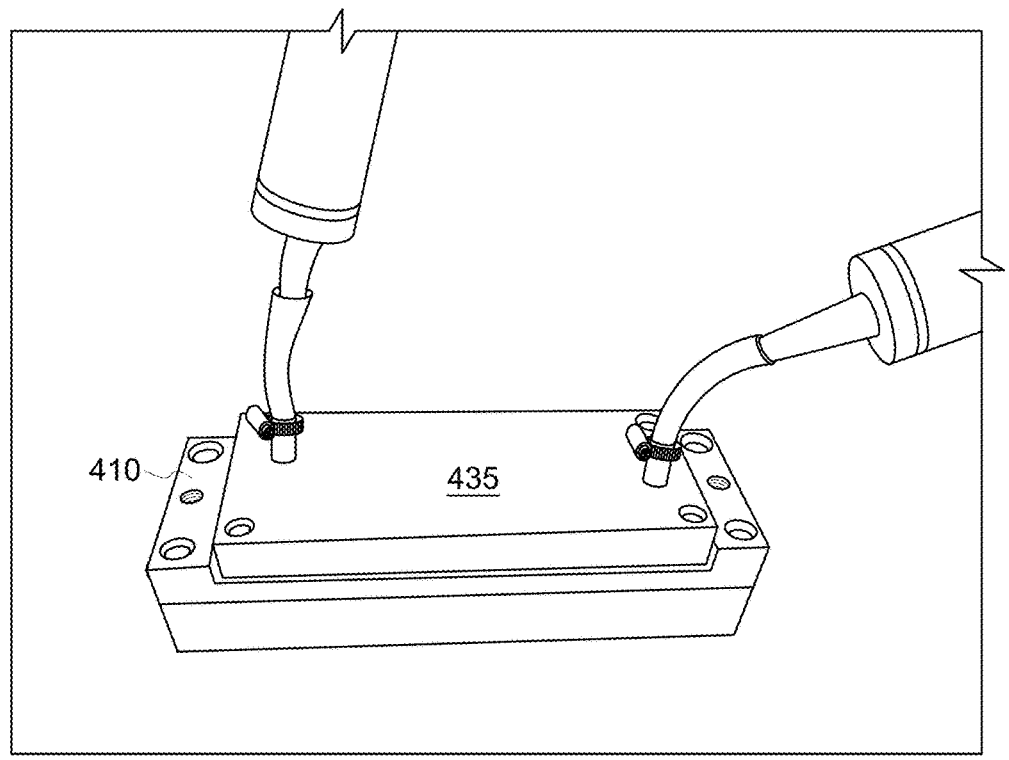

As shown in FIG. 4A, conventional LED filaments 405 may be located by registering their exposed metal leads in channels cut in a lower mold 410. An O-ring 415 may be placed in an O-ring gland 420 of the lower mold 410. Referring to FIG. 4B, O-rings 425 may be placed into two O-ring glands 430 of an upper mold 435. As shown in FIG. 4C, the upper mold 435 is placed onto the lower mold 410, may be located by steel dowel pins, and the two mold halves 410, 435 are fixed together securely. Fittings and tubing may be attached for injecting the overcoating material.

Figure 4D:
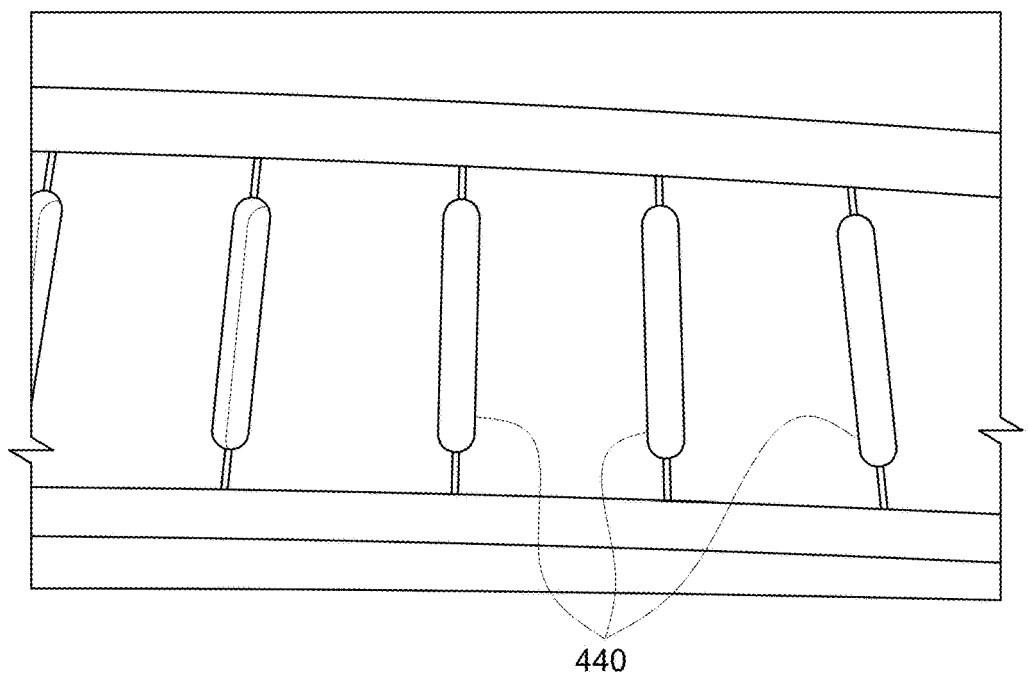

A first port into which the overcoating material will be injected may be clamped shut and a partial vacuum may be pulled on the mold halves 410, 435, either with a vacuum pump or by another mechanism through a second port. The overcoating material may be introduced into the first port as the clamp is released and the overcoating may be pushed into, and allowed to flow into, the mold halves 410, 435 by atmospheric pressure. The upper and lower mold halves 410, 435 may be heated at a curing temperature for a curing time, for example, approximately 100° C. for approximately 45 minutes. The mold halves 410, 435 may then be allowed to cool. In at least one example, the mold halves 410, 435 may be placed on a heatsink for approximately 10 minutes. The mold halves 410, 435 may be opened, as shown in FIG. 4D, and the overcoated LED filaments 440 may be removed and trimmed if necessary.

Figure 5:
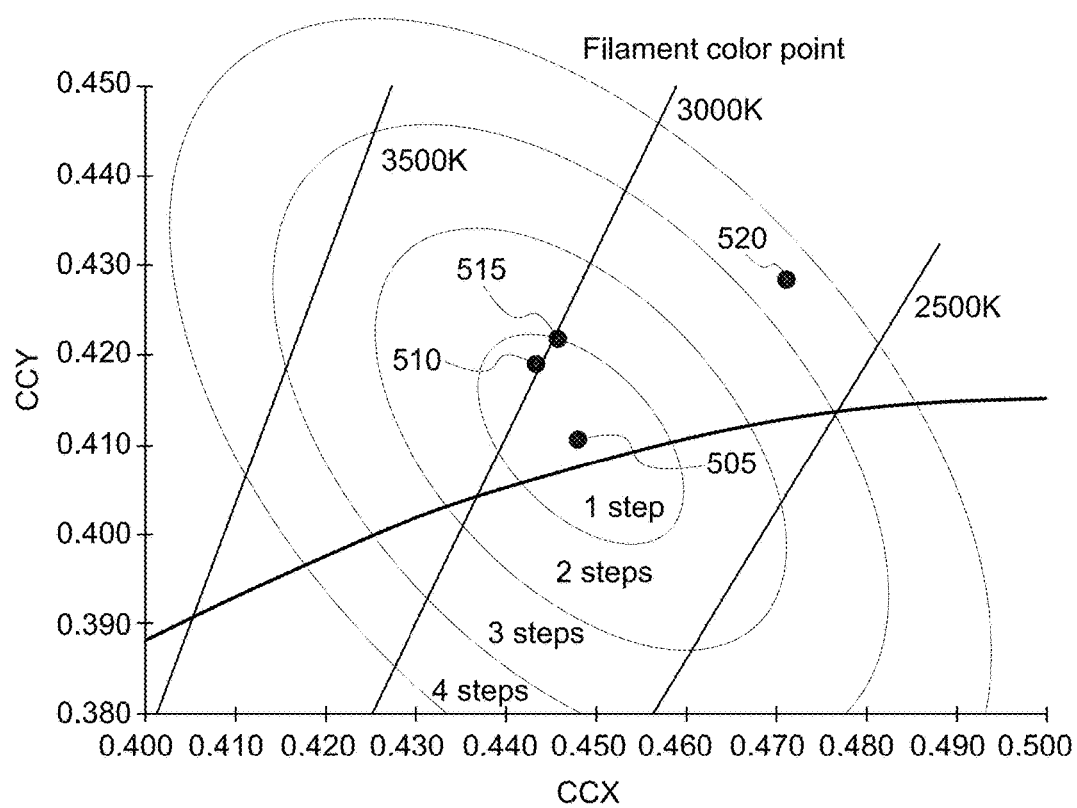
FIG. 5 shows exemplary color points of an LED filament without an overcoating and LED filaments with alumina loaded overcoatings as disclosed herein.

FIG. 5 shows exemplary color points of an LED filament without an overcoating and LED filaments with overcoatings of different thicknesses where the scattering agent is alumina ($Al_2O_3$, refractive index 1.77) as mentioned above.

As shown in FIG. 5, there is a color shift caused by the alumina scattering agent, with different color shifts resulting from different thicknesses of the overcoatings. Color point 505 represents an approximate average color point of a population of conventional LED filaments with a color covering. Color point 510 represents an approximate color point for a LED filament with a color covering and an amount of overcoating of 2.43 wt % alumina that results in a 3.6 mm finished diameter of the overcoated LED filament. Color point 515 represents an approximate color point for a LED filament with a color covering and an amount of overcoating of 2.43 wt % alumina that results in a 4.4 mm finished diameter of the overcoated LED filament. Color point 520 represents an approximate color point for a LED filament with a color covering and an amount of overcoating of 10.2 wt % alumina that results in a 3.6 mm finished diameter. The 1 step, 2 steps, 3 steps, and 4 steps designations indicate the MacAdam ellipses for various chromaticities. The application of the overcoating generally shifts the color point above the blackbody locus and to a lower Correlated Color Temperature (CCT), with thicker coatings and higher wt % loadings causing a more dramatic shift.

Figure 6:
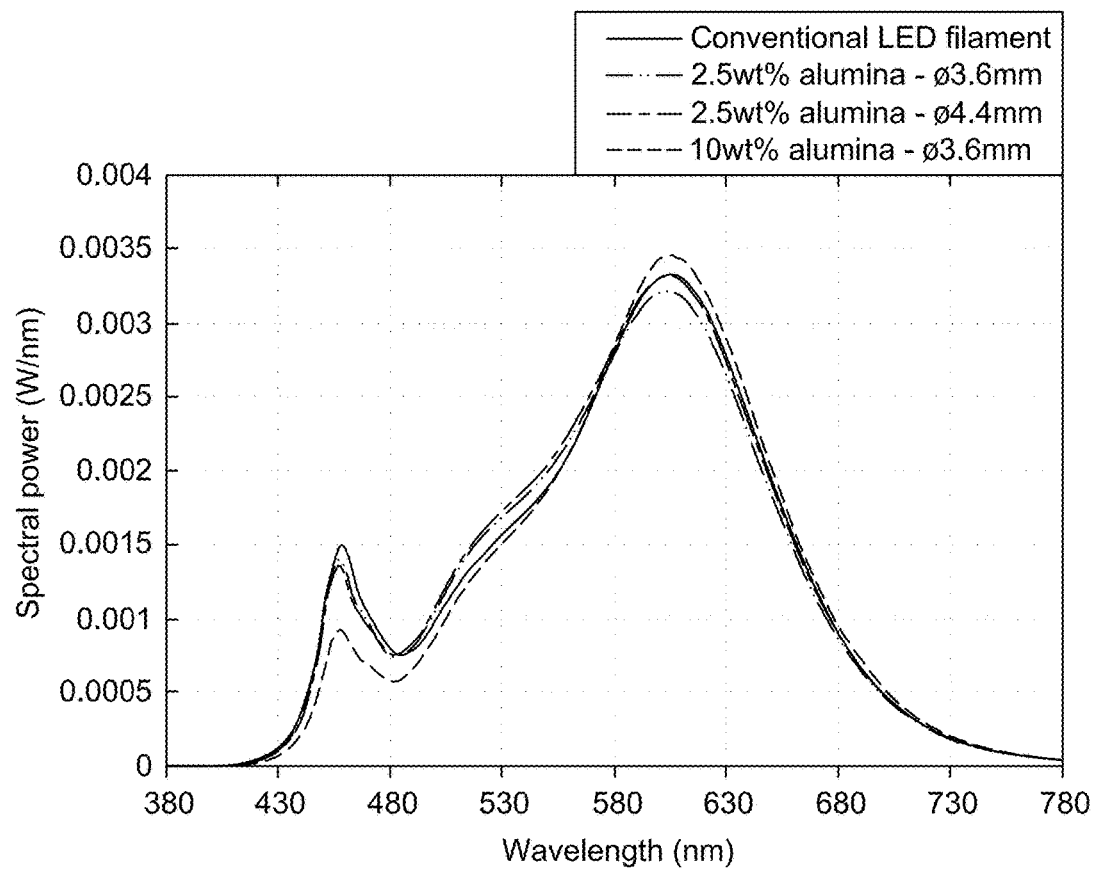
FIG. 6 illustrates spectral power distributions of the LED filaments whose characteristics are shown in FIG. 5.

FIG. 6 illustrates the spectral power distributions of the same selection of filaments whose characteristics are shown in FIG. 5. The overcoated filaments generally show a lowered blue bleed-through and an increased phosphor emission.

The emission with peak wavelength of 450 nm shown in FIG. 6 is the blue-bleed through. This is emission directly from an LED die that is not absorbed either by phosphors, or other non-intentional absorbers. With an increased amount of scattering agent (that is, either increased loading or thickness), the blue bleed through is decreased. This is because the added white overcoating scatters all incident light, including the blue emission. Some amount of blue emission that, in an un-coated filament, would contribute to the total emission of the filament is instead scattered back into the phosphor underlayer, where it is absorbed. The blue emission that is absorbed by the phosphor underlayer is re-emitted as phosphor emission, seen in primarily in the 500 nm-700 nm region.

The phosphor excitation and emission process is not a lossless process, with losses occurring due to Stokes shift losses and the quantum efficiency of the phosphor, so the radiated power of the coated filament decreases. The white flux may increase, because the Luminous Efficacy of Radiation of the coated filament spectrum is greater than that of the uncoated filament.

Luminous flux is weighted based on the luminosity function, which weights spectral radiation based on photopic vision. The luminosity function is much greater in the regions of the phosphor emission (in the green region) than it is in the region of the die emission (blue).

Figure 7A:
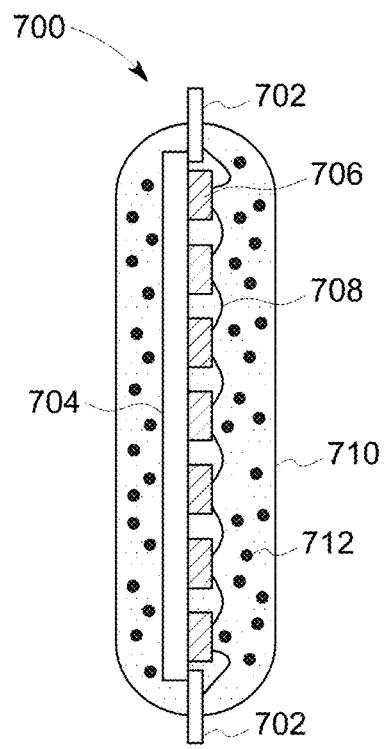
FIGS. 7A-7F illustrate a phosphor excitation and emission process achieved by the disclosed embodiments.
Figure 7B:
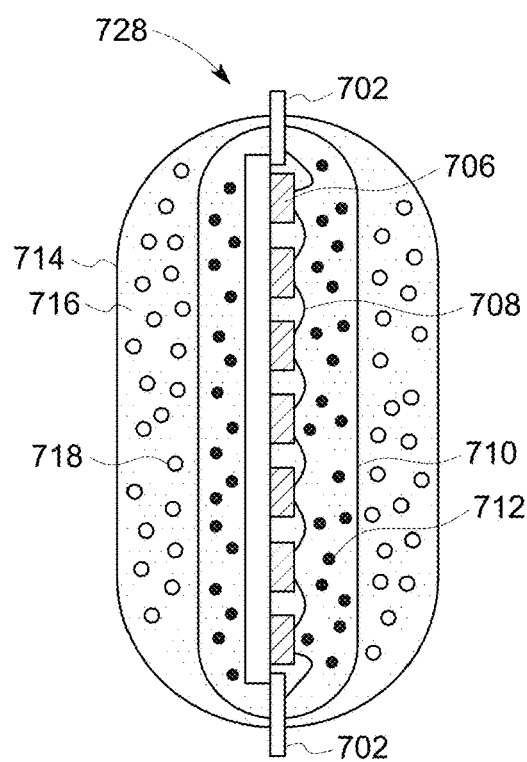

FIGS. 7A-7F further illustrate this phenomenon. FIG. 7A shows the structure of a conventional LED filament 700. Metal leads 702 are typically attached to a substrate 704 on which are mounted a series of LED dies 706. The metal leads 702 and LED dies 706 are electrically coupled by wire bonds 708 and the assembly is encapsulated using an underlying layer 710 which typically includes phosphor particles 712. As shown in FIG. 7B, the LED filament may be over-coated with a layer 714 comprising a resinous material 716 loaded with a scattering agent 718.

Figure 7C:
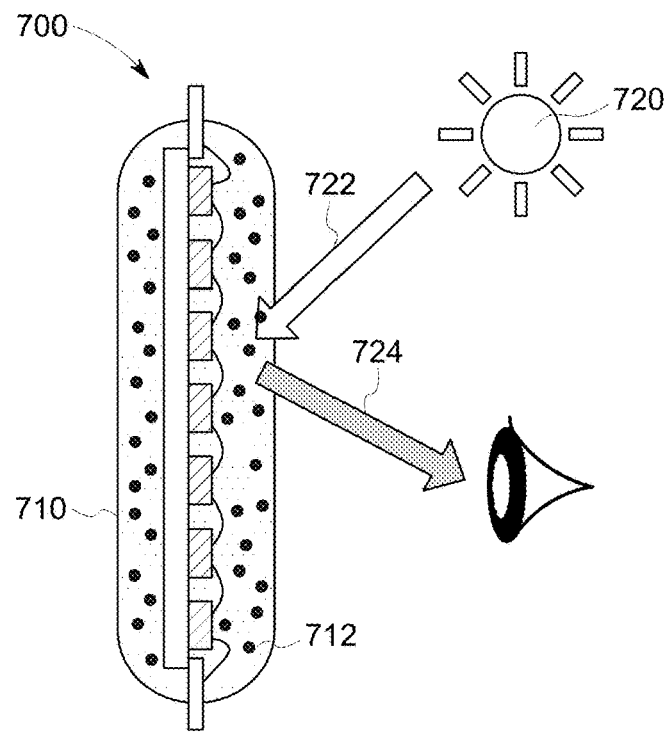
Figure 7D:
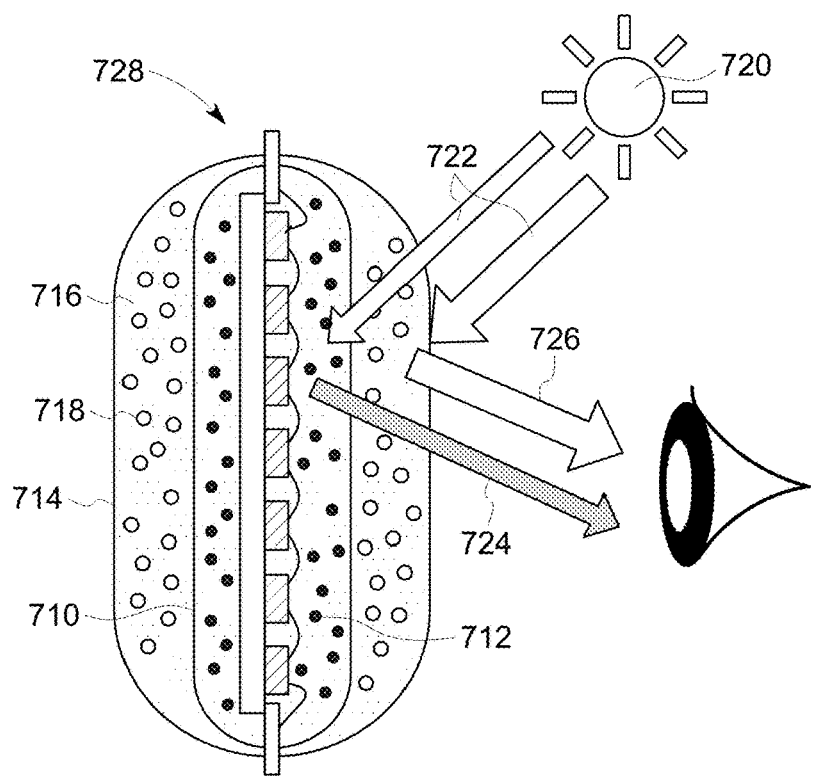

FIGS. 7C and 7D depict the differences in appearance of the LED filaments 700, 728 in the unlit state. Referring to FIG. 7C, a light source 720 provides white light 722 that impinges on the underlying layer 710. The phosphor particles 712 absorb the blue portion of the incident light and reflect the non-absorbed part 724, resulting in a yellow appearance. Turning to FIG. 7D, the light source 720 also provides white light 722, however most of the white light is scattered by the over-coated layer 714 of resinous material 716 loaded with the scattering agent 718. Only a portion of the light 722 passes through the over-coated layer 714 and is reflected from the underlying layer 710. The light 726 reflected from the over-coated layer 714 is seen as white, and the light 724 reflected from the underlying layer 710 is seen as yellow, but because only a portion of the light 722 is reflected from the underlying layer 710, the overall appearance is whiter than the conventional LED filament 700.

Figure 7E:
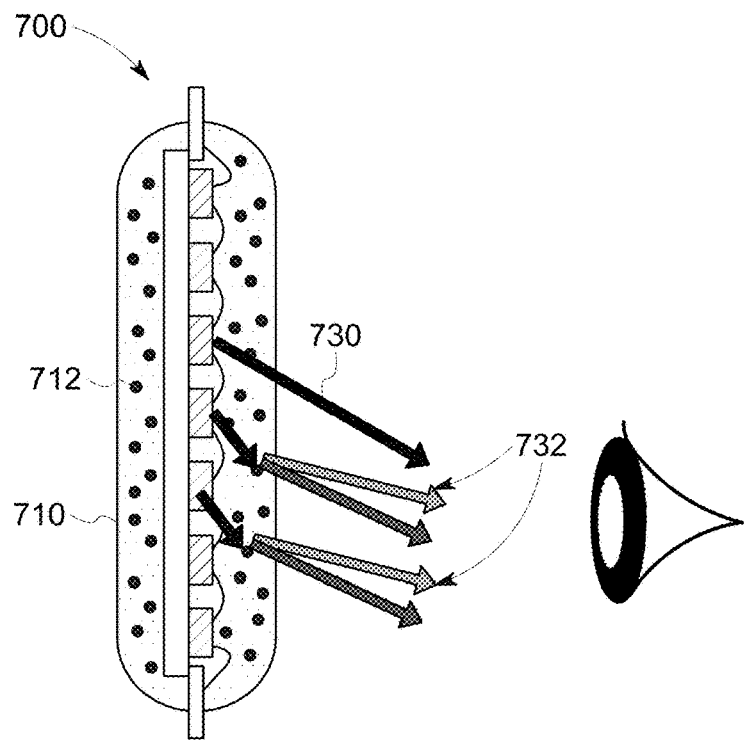
Figure 7F:
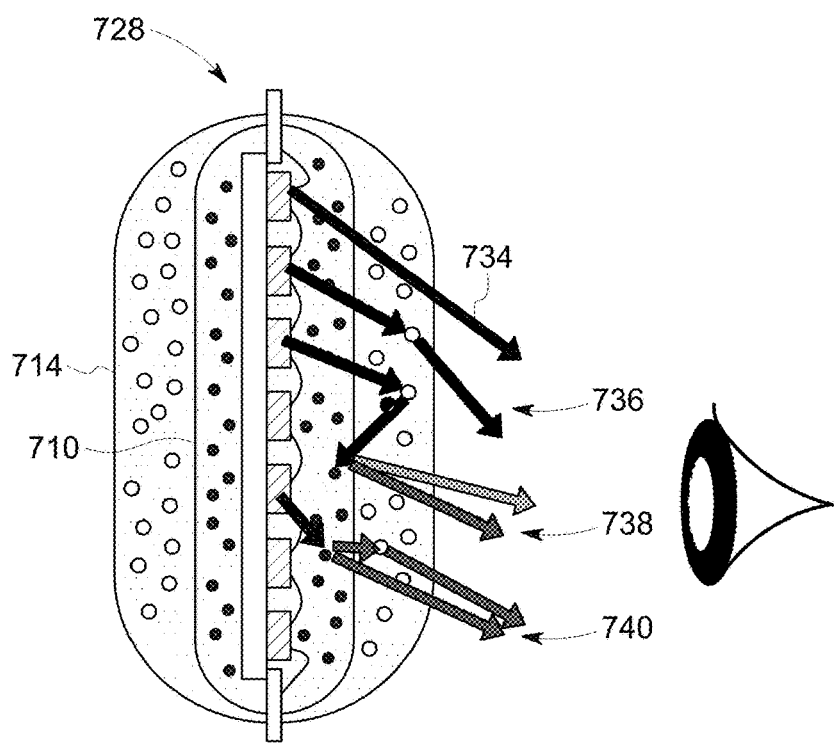

FIGS. 7E and 7F show the operations of the conventional LED filament 700, and the over-coated LED filament 728 when power is applied. As shown in FIG. 7E, in the conventional LED filament 700, some blue bleed through occurs, that is, some of the blue light 730 from the LED dies passes through the underlying layer 710 without being absorbed by the phosphor particles 712. Most of the blue light is absorbed by the phosphor particles 712 and is re-emitted as light 732 with longer wavelengths, generally resulting in the emission of white light. As shown in FIG. 7F, some of the blue light 734 from the LED dies passes through the underlying layer 710 and the over-coated layer 714 without being absorbed or scattered. Some of the blue light passes through the underlying layer 710, and the light 736 is then scattered by the over-coated layer 714 without any color change. Some of the blue light passes through the underlying layer 710, and is scattered back into the underlying layer 710, where it is re-absorbed and re-emitted 738. This results in lower blue bleed through and higher phosphor emission. As indicated by 740, the over-coating layer 714 may scatter phosphor emission from the underlying layer 710, but the scattering does not change the light's color.

Turning now to FIGS. 8A-8D, FIG. 8A shows the magnitude of the shift in color point in the CIE 1931 color space as a function of the overall diameter of a filament coated with an overcoating comprising silicone with a loading of 10% by weight of alumina powder. The magnitude of color shift increases as the diameter or thickness of the overcoating increases.

Figure 8A:
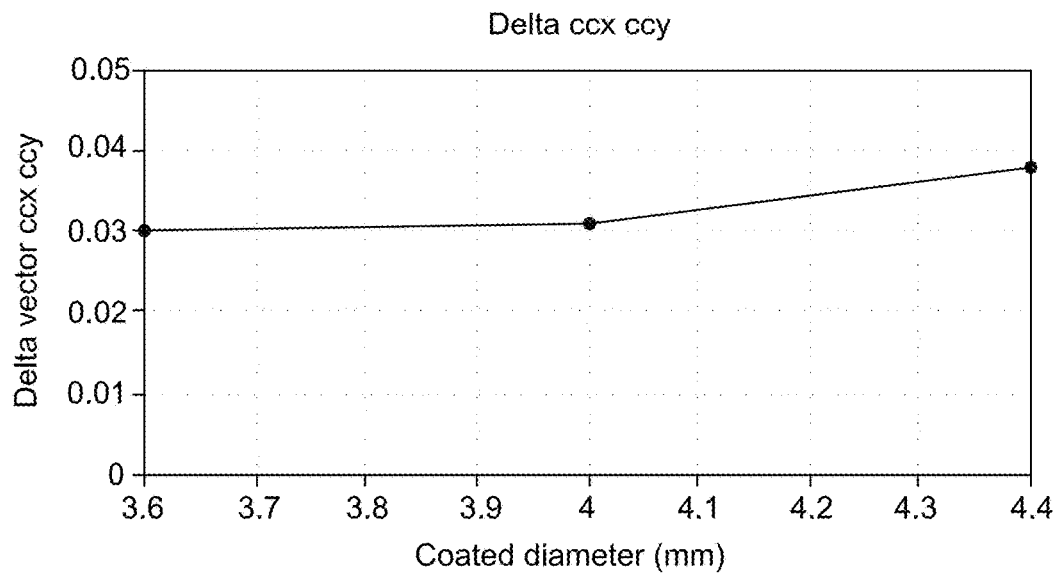
FIG. 8A shows a magnitude of a shift in color point in the CIE 1931 color space as a function of the overall diameter of an exemplary alumina overcoated LED filament.
Figure 8B:
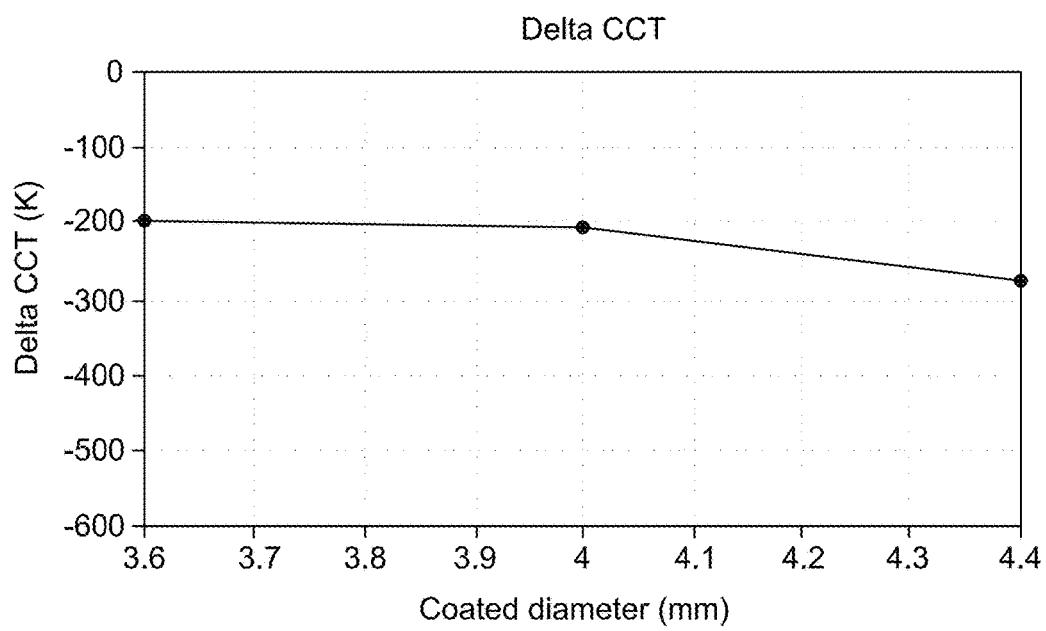
FIG. 8B shows a magnitude of a color temperature shift as a function of changes in the overall diameter of the exemplary alumina overcoated filament.

FIG. 8B shows the magnitude of the color temperature shift as a function of changes in the overall diameter of the coated filament as the same loaded overcoating diameter changes. Correlated color temperature shifts lower (warmer, less blue) with increased overcoating thickness because there is less blue bleed through and greater phosphor emission.

Figure 8C:
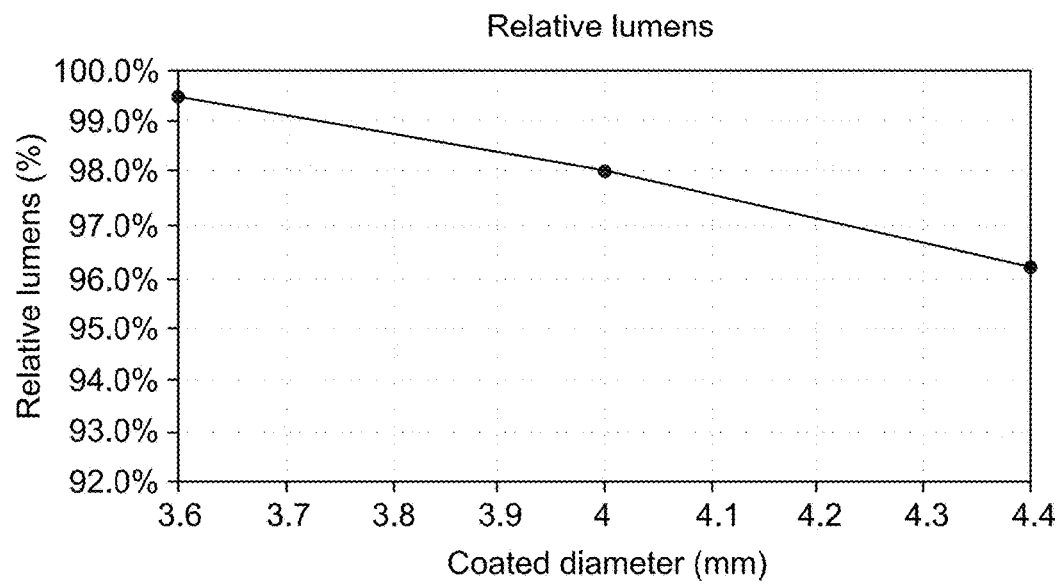
FIG. 8C shows a change in luminous flux as a function of overall filament diameter or thickness as the alumina overcoating diameter or thickness changes.

FIG. 8C shows the change in luminous flux as a function of overall filament diameter or thickness as the overcoating diameter or thickness changes. Losses are greater as the overcoating diameter increases. The increase in overcoating thickness results in greater diffusion with more photons being directed back into the center of the filament where they may be absorbed by the LED die or other absorbing structures. With greater diffusion, more photons are also being refracted (or being refracted more times) by the scattering agent, which has some inherent absorption.

Figure 8D:
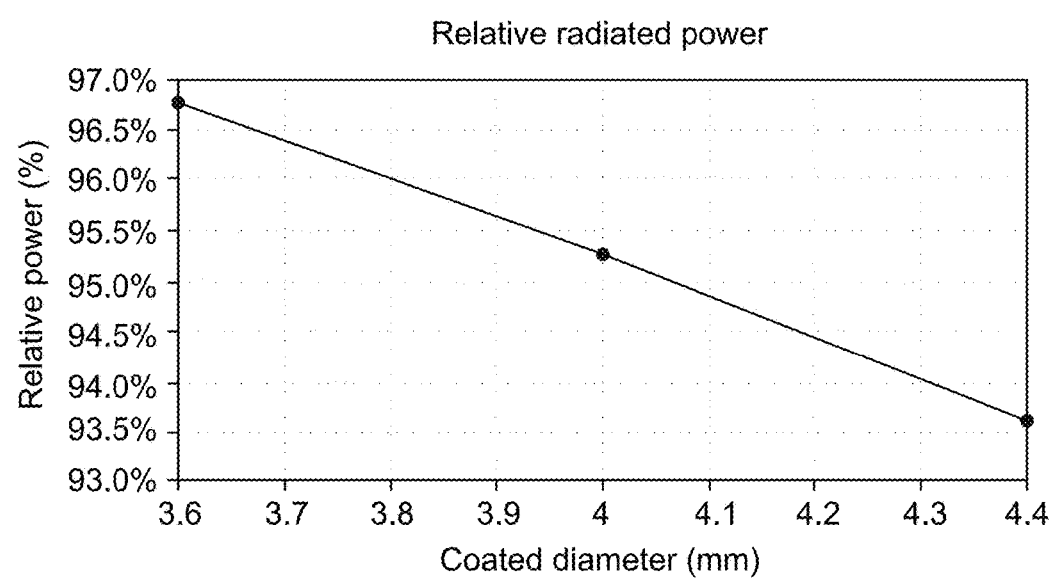
FIG. 8D shows the change in radiated power with respect to overcoated coated filament diameter changes due to changes in alumina overcoating thickness.

FIG. 8D shows the change in radiated power with respect to overcoated coated filament diameter changes due to changes in overcoating thickness. an increase in overcoating thickness or diameter results in greater diffusion with greater losses as described above for 7C. Luminous losses are less than the radiative losses because of the luminaire efficacy rating (LER) changes discussed previously.

Figure 9:
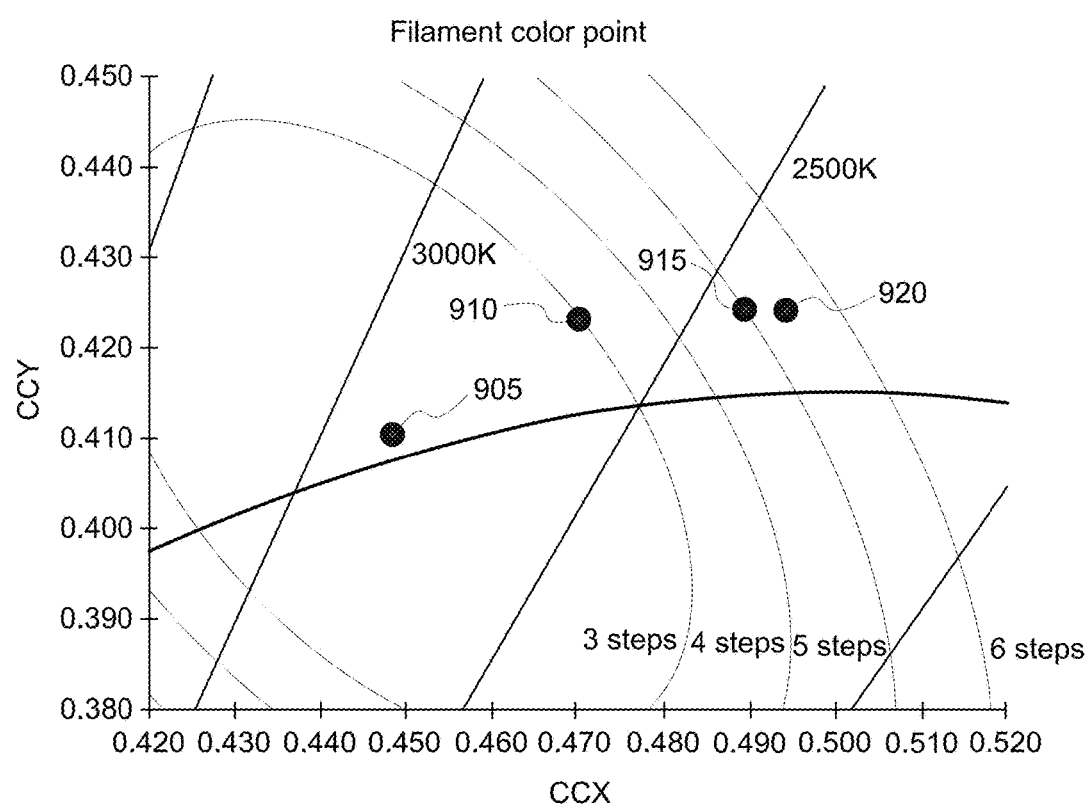
FIG. 9 shows exemplary color points of an LED filament without an overcoating and LED filaments with overcoatings of different thicknesses.

FIG. 9 shows exemplary color points of an LED filament without an overcoating and LED filaments with overcoatings of different thicknesses where the scattering agent is titania ($TiO_2$, refractive index 2.61). Because of the relatively high refractive index of titania compared to alumina, less titania material is required to obscure the color coating of the LED filaments.

The following examples where the scattering agent is titania utilize an approximately 1.0% loading by weight. FIG. 9 illustrates that different thicknesses of the titania scattering agent based overcoating cause different color shifts. The approximate average color point of a population of conventional LED filaments with a color covering is shown as color point 905.

An approximate color point for an LED filament with a colored-appearance covering but having an overlayer with a quantity of 1.0 wt % titania (i.e., by weight of scattering-agent and resinous material), that results in a 2.4 mm finished diameter of the overcoated LED filament, is shown at color point 910. Color point 915 represents an approximate color point for a LED filament with a color covering and an amount of overcoating of 1.0 wt % titania that results in a 3.2 mm finished diameter of the overcoated LED filament. An approximate color point for a LED filament with a color covering and an amount of overcoating of 1.0 wt % titania that results in a 3.6 mm finished diameter is shown at color point 920. The application of the overcoating generally shifts the color point above the blackbody locus and to a lower Correlated Color Temperature (CCT), with thicker coatings and higher wt % loadings causing a more dramatic shift.

Figure 10:
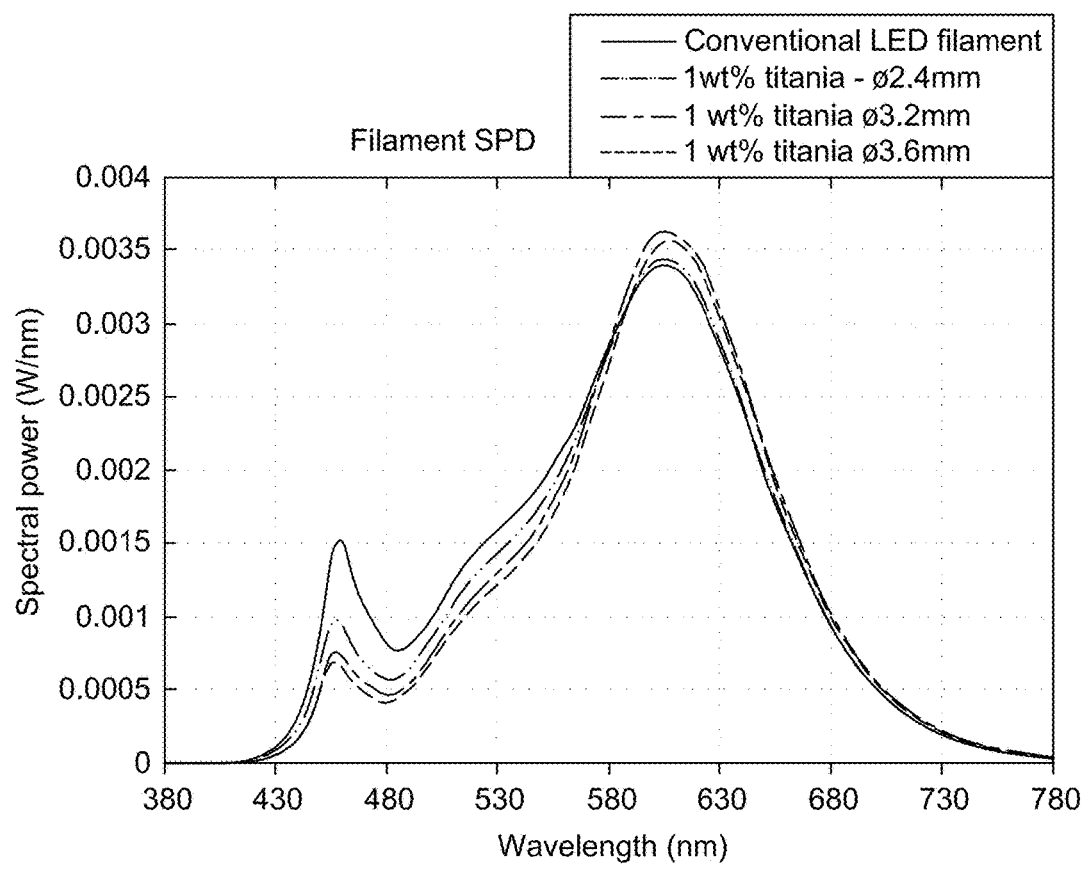
FIG. 10 illustrates the spectral power distributions of the same selection of filaments whose characteristics are shown in FIG. 9.

FIG. 10 illustrates the spectral power distributions of the same selection of filaments whose characteristics are shown in FIG. 9. The blue bleed-through is significantly reduced, especially at higher diameters.

Turning now to FIGS. 11A-11D, FIG. 11A shows the magnitude of the shift in color point in the CIE 1931 color space as a function of the overall diameter of a filament coated with an overcoating comprising silicone with a loading of 1.0% by weight of titania powder. The magnitude of color shift increases as the diameter or thickness of the overcoating increases.

Figure 11A:
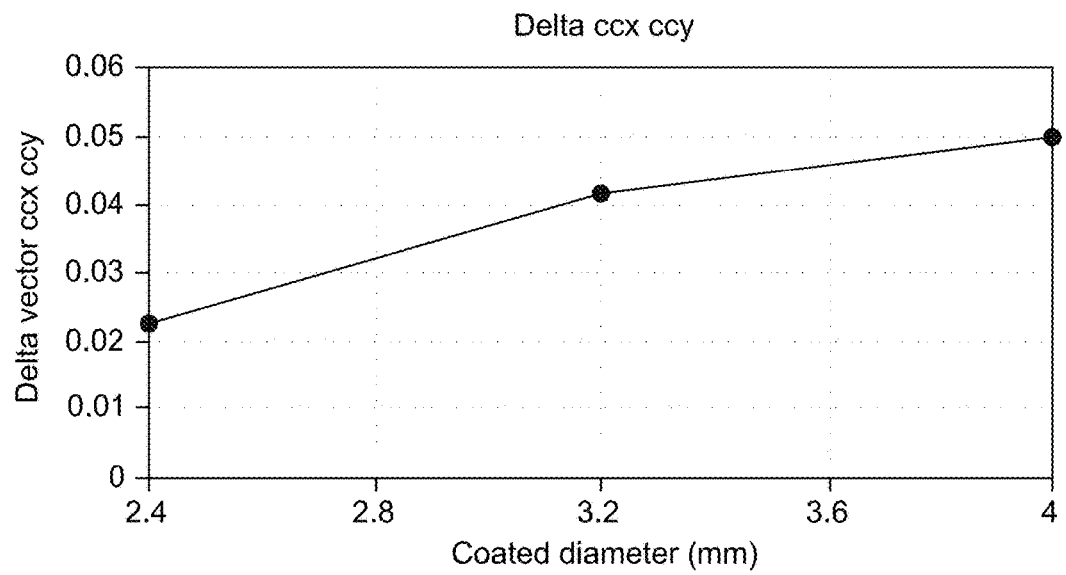
FIG. 11A shows a magnitude of a shift in color point in the CIE 1931 color space as a function of the overall diameter of an exemplary titania overcoated LED filament.
Figure 11B:
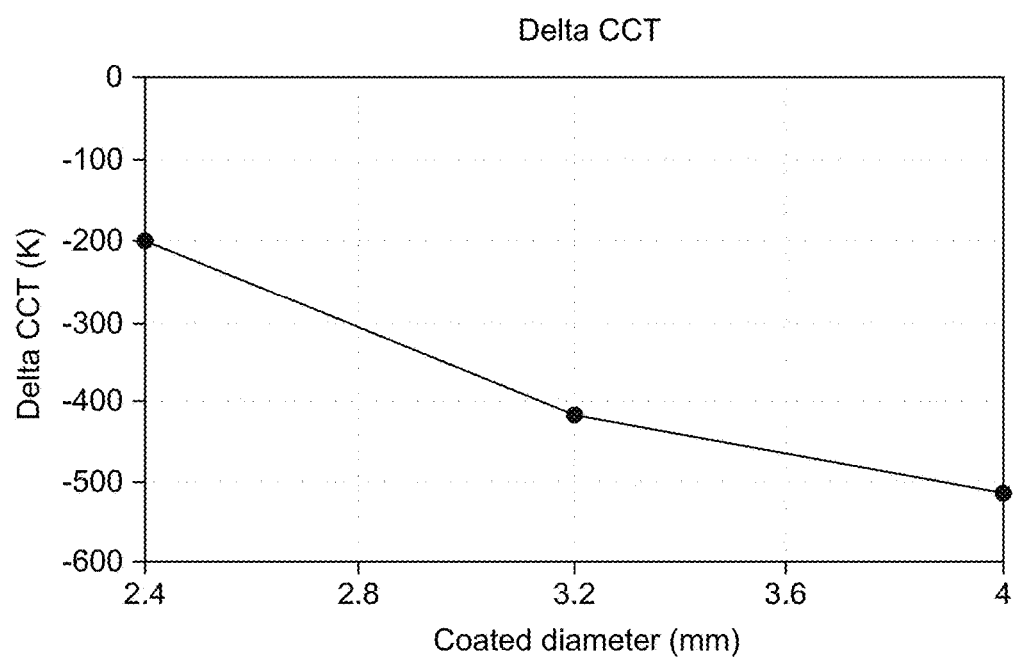
FIG. 11B shows a magnitude of a color temperature shift as a function of changes in the overall diameter of the exemplary titania overcoated filament.

FIG. 11B shows the magnitude of the color temperature shift as a function of changes in the overall diameter of the coated filament as the same loaded overcoating diameter changes. As with alumina, correlated color temperature shifts lower (warmer, less blue) with increased overcoating thickness because there is less blue bleed through and greater phosphor emission.

Figure 11C:
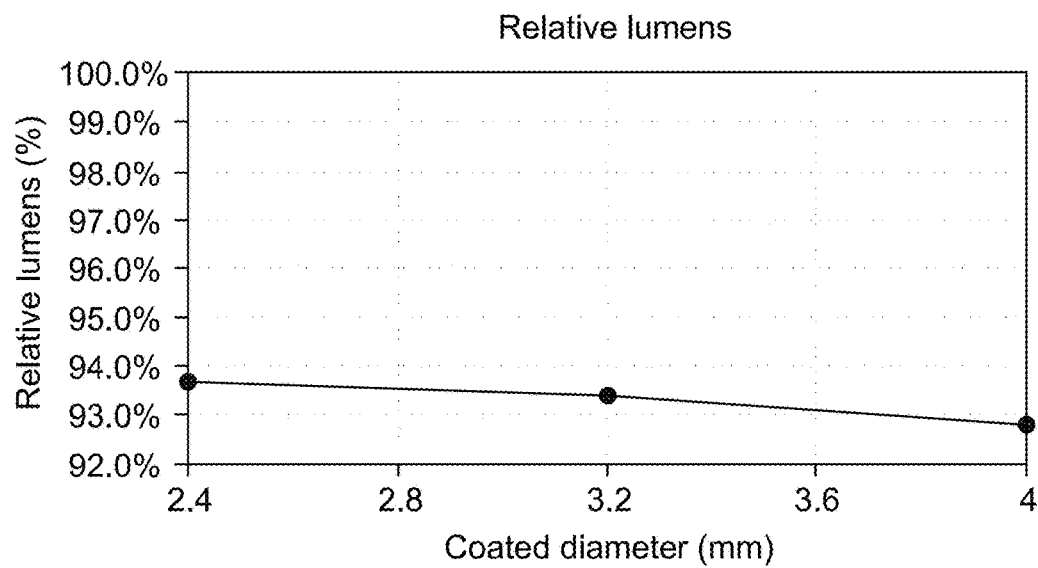
FIG. 11C shows a change in luminous flux as a function of overall filament diameter or thickness as the titania overcoating diameter or thickness changes.

FIG. 11C shows the change in luminous flux as a function of overall filament diameter or thickness as the titania based overcoating diameter or thickness changes. Losses increase slightly as the overcoating diameter increases. The increase in overcoating thickness results in greater diffusion with more photons being directed back into the center of the filament where they may be absorbed by the LED die or other absorbing structures.

Figure 11D:
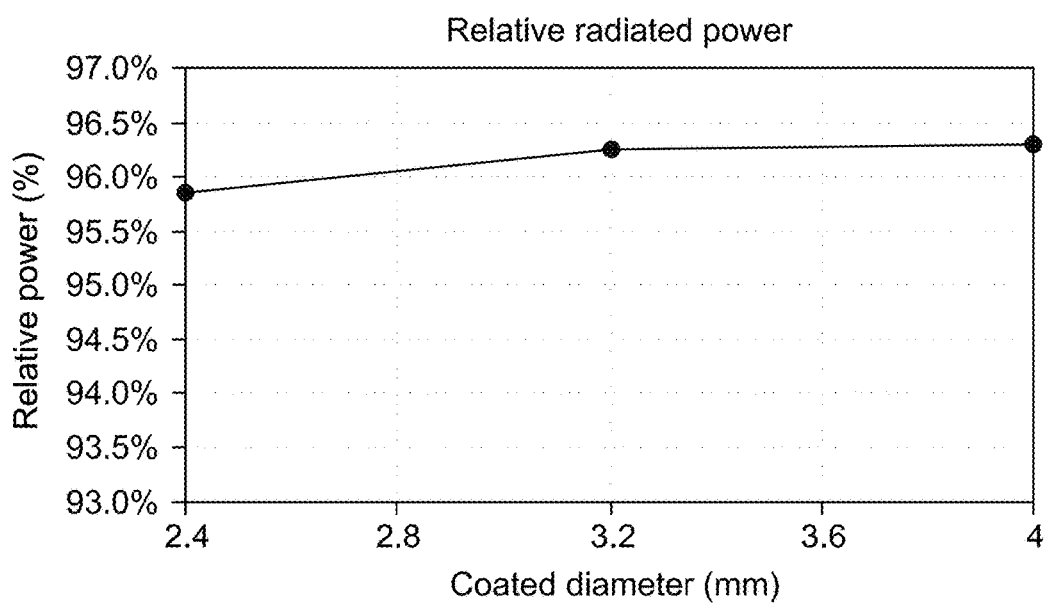
FIG. 11D shows the change in radiated power with respect to overcoated coated filament diameter changes due to changes in titania overcoating thickness.

FIG. 11D shows the change in radiated power with respect to the titania overcoated filament diameter changes due to changes in overcoating thickness. An increase in overcoating thickness or diameter results in increased radiative power.

It can be seen that by weight %, titania has approximately the same whitening effect as one order of magnitude greater weight % of alumina (e.g. 1 wt % titania is approximately equal to 10 wt % alumina).

Figure 12:
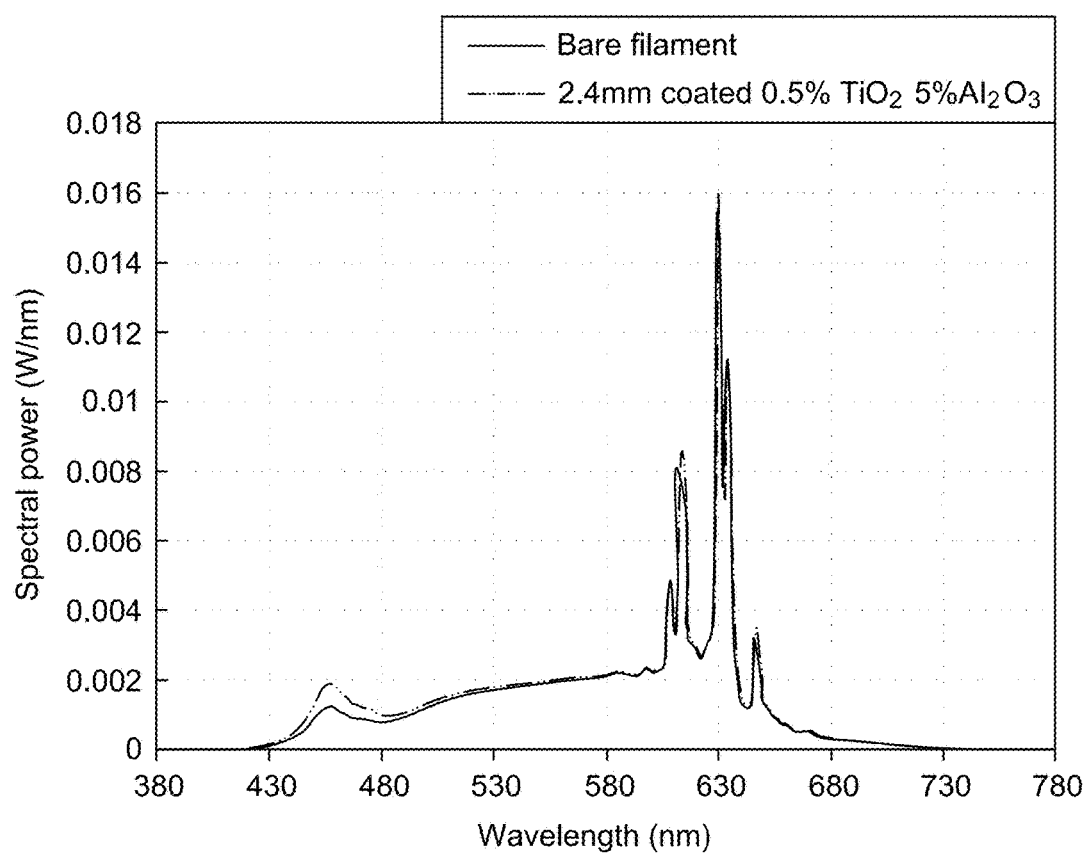
FIG. 12 illustrates the difference is spectral power distribution between a conventional LED filament and an LED filament overcoated with a titania alumina blend.

FIG. 12 illustrates the difference is spectral power distribution between a conventional LED filament comprising a $Mn^{4+}$ activated complex fluoride phosphor such as PFS phosphor ($K_2SiF_6:Mn^{4+}$) and an LED filament overcoated with a 2.4 mm diameter silicone layer with a loading of 0.5% $TiO_2$+5% $Al_2O_3$. A minimal change in spectral power is observed between uncoated and coated filaments. The corresponding Table 1 below shows the approximate measured reduction optical power in this case. Generally about <4% loss may be expected.

TABLE 1

| Coating | Coated Diameter (mm) | Delta ccx ccy | Delta CCT | % lm | % Wr |
|---|---|---|---|---|---|
| 0.5% TiO2, 5.0% Al2O3 | 2.4 | 0.0272 | −132 | 96.6% | 93.4% |

Referring to FIGS. 13A-13D, FIG. 13A shows the magnitude of the shift in color point in the CIE 1931 color space as a function of the overall diameter of the filament comprising the $Mn^{4+}$ activated complex fluoride phosphor overcoated with the 2.4 mm diameter silicone layer with a 0.5% $TiO_2$+5% $Al_2O_3$ loading. The magnitude of color shift increases as the diameter or thickness of the overcoating increases.

Figure 13A:
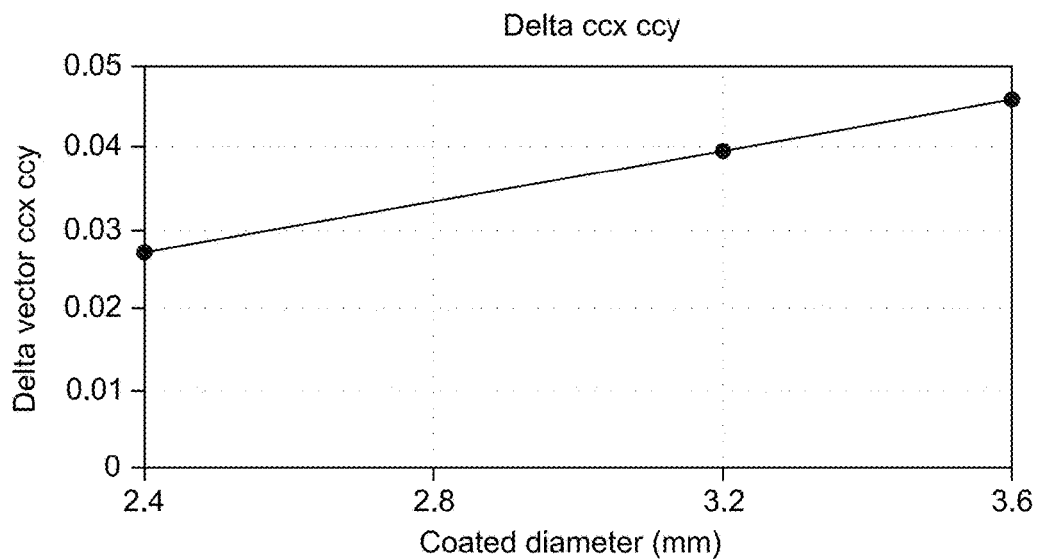
FIG. 13A shows the magnitude of the shift in color point in the CIE 1931 color space as a function of the overall diameter of a filament overcoated with the titania alumina blend.
Figure 13B:
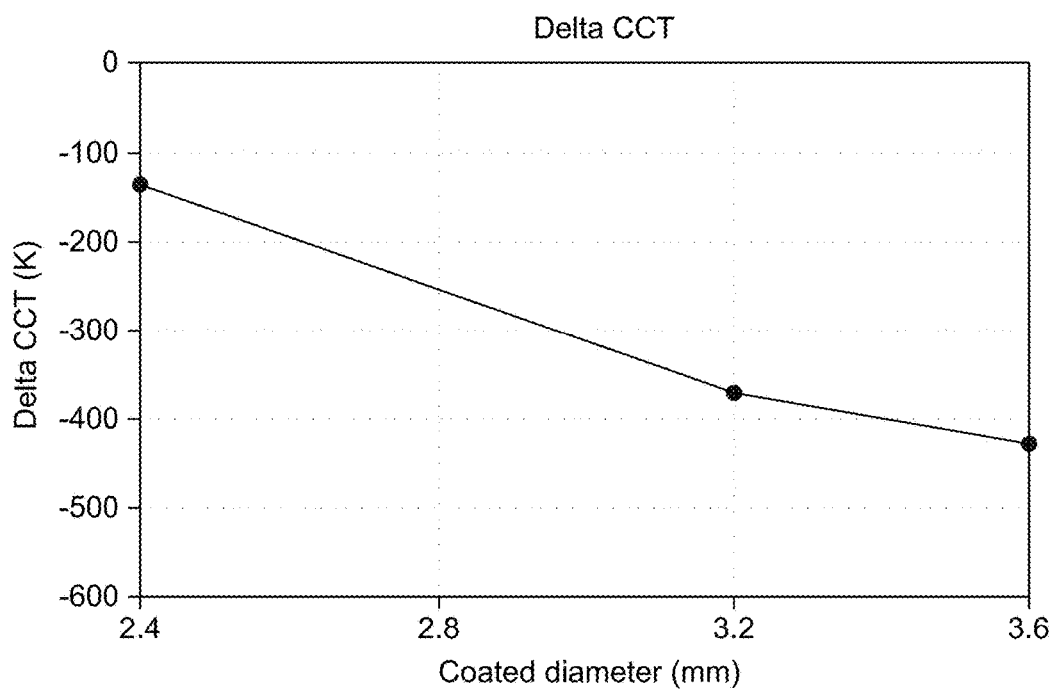
FIG. 13B shows the magnitude of the color temperature shift as a function of changes in the overall diameter of the filament overcoated with the titania alumina blend.

FIG. 13B shows the magnitude of the color temperature shift as a function of changes in the overall diameter of the overcoated coated filament of FIG. 13A as the same loaded overcoating diameter changes. The correlated color temperature shifts lower (warmer, less blue) with increased overcoating thickness because there is less blue bleed through and greater phosphor emission.

Figure 13C:
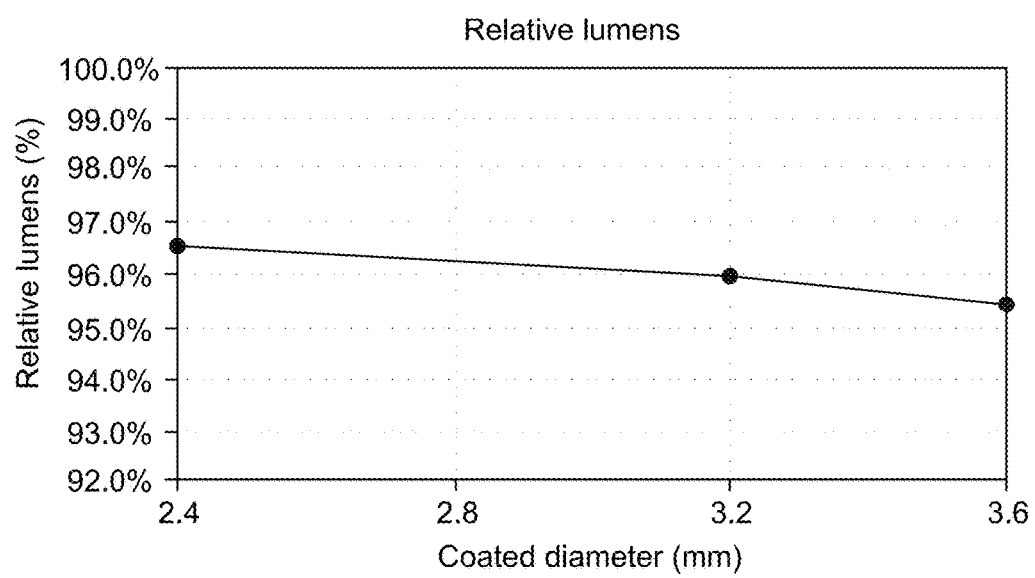
FIG. 13C shows the change in luminous flux as a function of overall filament diameter of the filament overcoated with the titania alumina blend.

FIG. 13C shows the change in luminous flux as a function of overall filament diameter or thickness as the 0.5% $TiO_2$+5% $Al_2O_3$ based overcoating diameter or thickness changes. Losses increase slightly as the overcoating diameter increases. The increase in overcoating thickness results in greater diffusion with more photons being directed back into the center of the filament where they may be absorbed by the LED die or other absorbing structures.

Figure 13D:
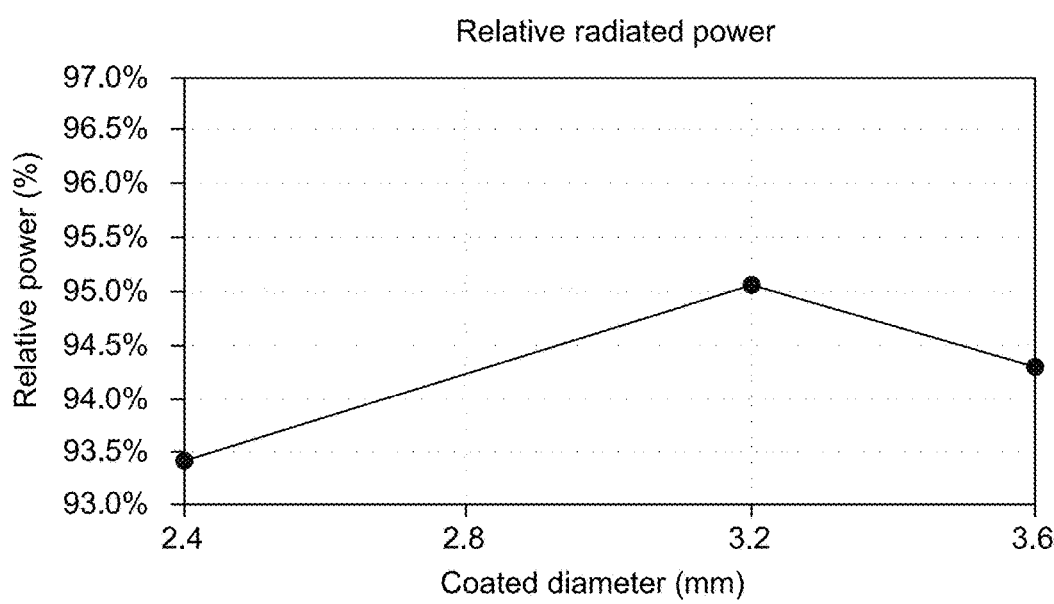
FIG. 13D shows the change in radiated power with respect to the titania alumina overcoated filament diameter changes.

FIG. 13D shows the change in radiated power with respect to the 0.5% $TiO_2$+5% Al2O3 overcoated filament diameter changes due to changes in overcoating thickness.

It should be understood that the $Al_2O_3$ and $TiO_2$ materials may be combined in any suitable proportion that achieves approximately similar levels of perceived whiteness. For example, 5% Al2O3+0.5% TiO2, 7% Al2O3+0.3% TiO2, and 9% Al2O3+0.1% TiO2 may be viable combinations according to the disclosed embodiments.

Figure 14:
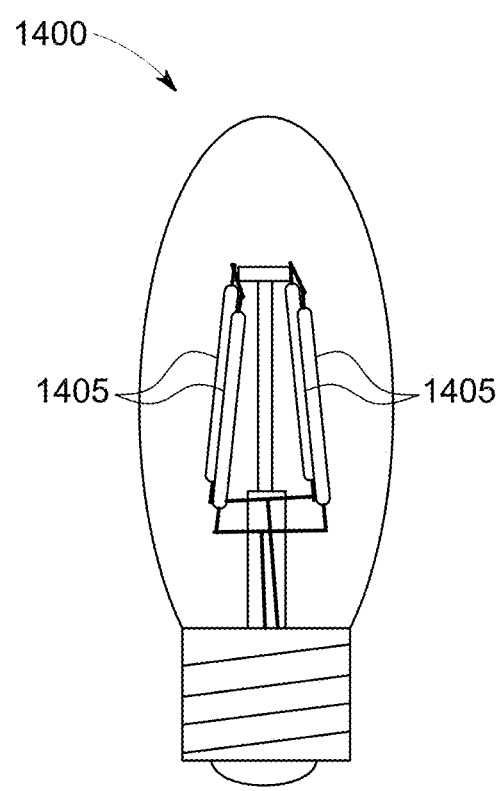
FIG. 14 shows a lighting apparatus incorporating an overcoated LED filament as disclosed herein.

FIG. 14 shows a lighting apparatus 1400 incorporating an overcoated LED filament 1405 as disclosed herein.

It is noted that the embodiments described herein can be used individually or in any combination thereof. It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

Various modifications and adaptations may become apparent to those skilled in the relevant arts in view of the foregoing description, when read in conjunction with the accompanying drawings. However, all such and similar modifications of the teachings of the disclosed embodiments will still fall within the scope of the disclosed embodiments.

Various features of the different embodiments described herein are interchangeable, one with the other. The various described features, as well as any known equivalents can be mixed and matched to construct additional embodiments and techniques in accordance with the principles of this disclosure.

Furthermore, some of the features of the exemplary embodiments could be used to advantage without the corresponding use of other features. As such, the foregoing description should be considered as merely illustrative of the principles of the disclosed embodiments and not in limitation thereof.

The invention claimed is:

1. An overcoated LED filament comprising:
    an LED filament comprising a plurality of LED dies mounted serially along the length of a transparent substrate, the LED dies and the transparent substrate being encapsulated within an underlying layer coating of a phosphor material exhibiting a colored appearance; and
    an over-coated layer completely coating the underlying layer coating and comprising a resinous material loaded with a scattering agent that causes the LED filament to appear white;
    wherein the LED filament is in an unlit state.

2. The overcoated LED filament of claim 1, wherein the colored appearance of the underlying layer coating of the phosphor material is a yellow, orange, or red appearance.

3. The overcoated LED filament of claim 1, wherein the underlying layer coating of the phosphor material comprises a doped phosphor with a fluoride host.

4. The overcoated LED filament of claim 1, wherein the underlying layer coating of the phosphor material comprises PFS phosphor having the formula $K_2SiF_6:Mn^{4+}$.

5. The overcoated LED filament of claim 1, wherein the underlying layer coating of the phosphor material comprises a yellow-emitting phosphor, yellow-green- emitting phosphor or a garnet phosphor.

6. The overcoated LED filament of claim 1, wherein the underlying layer coating of the phosphor material comprises an red-emitting $Eu^{2+}$ red nitride phosphor.

7. The overcoated LED filament of claim 1, wherein the underlying layer coating of the phosphor material comprises an absorbing agent.

8. The overcoated LED filament of claim 1, wherein the underlying layer coating comprises the resinous material.

9. The overcoated LED filament of claim 1, wherein the resinous material loaded with a scattering agent exhibits a uniform reflectance across a visible range of light.

10. The overcoated LED filament of claim 1, wherein the resinous material exhibits a refractive index substantially matching a refractive index of the underlying layer coating.

11. The overcoated LED filament of claim 1, wherein the resinous material exhibits a coefficient of thermal expansion substantially matching a coefficient of thermal expansion of the underlying layer coating.

12. The overcoated LED filament of claim 1, wherein the scattering agent is inorganic and the resinous material and the scattering agent exhibit different indexes of refraction.

13. The overcoated LED filament of claim 12, wherein a difference between the index of refraction for the scattering agent and the index of refraction for the resinous material is at least 0.17.

14. The overcoated LED filament of claim 13, wherein the difference between the index of refraction for the scattering agent and the index of refraction for the resinous material is in a range of from 0.17 to 1.21.

15. The overcoated LED filament of claim 1, wherein the scattering agent comprises one or more of a fluoropolymer or a cyclic olefin copolymer.

16. The overcoated LED filament of claim 1, wherein the scattering agent comprises one or more non-absorbing metal oxides, metal nitrides or metal halides.

17. The overcoated LED filament of claim 1, wherein the scattering agent comprises one or more non-absorbing semiconductor oxides, semiconductor nitrides or semiconductor halides.

18. The overcoated LED filament of claim 1, wherein the scattering agent comprises one or more of alumina, titania, silica, zirconia, quartz, or glass powder.

19. The overcoated LED filament of claim 1, wherein the scattering agent comprises 0.1-10% by weight alumina.

20. The overcoated LED filament of claim 1, wherein the scattering agent comprises 0.01% -1% by weight titania.

21. The overcoated LED filament of claim 1, wherein the scattering agent comprises a combination of 3.0-7.0 by weight alumina and 0.1-0.5% by weight titania.

22. The overcoated LED filament of claim 1, wherein the over-coated layer comprises an absorbing agent.

23. The overcoated LED filament of claim 1, wherein the over-coated layer comprises a Neodymium compound.

24. A lighting apparatus comprising the overcoated LED filament of claim 1.

25. The overcoated LED filament of claim 1, wherein the transparent substrate is held in an envelope.

26. The overcoated LED filament of claim 1, wherein the over-coated layer further comprises one or more phosphors.

27. The overcoated LED filament of claim 26, wherein the one or more phosphors comprises one or more of a doped phosphor with a fluoride host, a PFS phosphor having the formula $K_2SiF_6:Mn^{4+}$, a garnet phosphor or an $Eu^+$red nitride phosphor.

28. The overcoated LED filament of claim 1, wherein the over-coated layer has a thickness in a range from 0.4 mm to 4.4 mm.

29. The overcoated LED filament of claim 1, wherein the LED filament comprises more than one LED dies.

30. The overcoated LED filament of claim 1, wherein the transparent substrate is glass or sapphire.

* * * * *